(12) United States Patent
Nakai

(10) Patent No.: US 8,138,659 B2
(45) Date of Patent: Mar. 20, 2012

(54) PIEZOELECTRIC COMPONENT AND METHOD FOR MANUFACTURING SAME

(75) Inventor: Yasuhiro Nakai, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 12/685,891

(22) Filed: Jan. 12, 2010

(65) Prior Publication Data
US 2010/0109483 A1    May 6, 2010

Related U.S. Application Data

(63) Continuation of application No. 11/911,107, filed as application No. PCT/JP2006/038832 on Apr. 27, 2006, now Pat. No. 7,649,306.

(30) Foreign Application Priority Data

Apr. 27, 2005 (JP) .................. 2005-129161
Mar. 28, 2006 (JP) .................. 2006-087615

(51) Int. Cl.
H01L 41/08 (2006.01)

(52) U.S. Cl. ......... 310/344; 310/348; 310/365; 310/366

(58) Field of Classification Search .................. 310/344, 310/340, 320, 348, 366, 311, 321; 333/186; H03H 9/02
See application file for complete search history.

(56) References Cited

U.S. PATENT DOCUMENTS

| | | | |
|---|---|---|---|
| 5,406,230 A | | 4/1995 | Yamamoto |
| 6,160,462 A * | 12/2000 | Sugiyama et al. ............. 333/189 |
| 6,215,229 B1 * | 4/2001 | Kuroda et al. ................ 310/366 |
| 6,274,968 B1 * | 8/2001 | Wajima et al. ................ 310/348 |
| 6,373,169 B1 | 4/2002 | Wajima |
| 6,531,806 B1 | 3/2003 | Daidai |
| 6,744,179 B2 * | 6/2004 | Wajima et al. ................ 310/344 |

FOREIGN PATENT DOCUMENTS

JP    50-110217    6/1984

(Continued)

OTHER PUBLICATIONS

Office Action dated Jan. 20, 2011 for counterpart Japanese Application No. JP2007-514805.

*Primary Examiner* — Thomas Dougherty
*Assistant Examiner* — Karen B Addison
(74) *Attorney, Agent, or Firm* — Procopio, Cory, Hargreaves & Savitch LLP

(57) ABSTRACT

Disclosed is a piezoelectric component (1) comprising a piezoelectric transducer (10) wherein a pair of electrodes (20a, 20b) are formed on both major surfaces of a piezoelectric substrate (11), a pair of frame members (30a, 30b) fitted to both major surfaces of the piezoelectric transducer (10), a pair of sealing substrates (40a, 40b) composed of a light-transmitting resin material and so fitted as to cover the frame members (30a, 30b), opaque coating layers (50a, 50b) respectively formed on the sealing substrates (40a, 40b), and a pair of input/output terminal electrodes (61a, 61b) respectively connected to the electrodes (20a, 20b). By having such a constitution, the state of sealed space and sealing widths of the frame members (30a, 30b) can be checked by visual examination such as direct visual observation or image recognition, and thus a highly reliable piezoelectric component (1) can be obtained. In addition, a mark can be made on the coating layers (50a, 50b).

14 Claims, 9 Drawing Sheets

FOREIGN PATENT DOCUMENTS

| | | | |
|---|---|---|---|
| JP | S59-110217 A | 6/1984 | |
| JP | S61-037624 U | 3/1986 | |
| JP | 3-248613 | * 3/1991 | |
| JP | H03-052312 A | 3/1991 | |
| JP | H03-248613 A | 11/1991 | |
| JP | H05-018119 U | 3/1993 | |
| JP | 2005-218790 | 8/1993 | |
| JP | H05-218790 A | 8/1993 | |
| JP | H05-076119 U | 10/1993 | |
| JP | H05-315885 A | 11/1993 | |
| JP | H06-244670 A | 2/1994 | |
| JP | H08-204496 A | 8/1996 | |
| JP | H09-116363 A | 5/1997 | |
| JP | H10-242788 A | 9/1998 | |
| JP | 2002-124845 A | 4/2002 | |
| JP | 2002-190539 A | 7/2002 | |
| JP | 2003-248613 | 9/2003 | |
| JP | 2003-304137 | 10/2003 | |
| JP | 2003304137 A | * 10/2003 | |
| JP | 2004-119625 A | 4/2004 | |

* cited by examiner

PIEZOELECTRIC COMPONENT AND METHOD FOR MANUFACTURING SAME

CROSS REFERENCE TO RELATED APPLICATIONS

The present application is a continuation of U.S. patent application Ser. No. 11/911,107 (issued as U.S. Pat. No. 7,649,306 on Jan. 19, 2010) which is the U.S. national phase application of PCT/JP2006/308832 filed Apr. 27, 2006 and claims the benefit of Japanese patent application serial number JP2006-087614 filed Mar. 28, 2006 and Japanese patent application number JP2005-129161 filed Apr. 27, 2005, each of which is incorporated herein by reference in its entirety.

FIELD OF THE INVENTION

The present invention relates to a piezoelectric component which is easily manufactured and is in reliability and relates to a method for manufacturing such a piezoelectric component.

BACKGROUND

In general, microcomputers are used in communication equipment and electronic equipment. In such microcomputers, piezoelectric components including piezoelectric resonator are widely used as clock sources.

In a known piezoelectric component, vibrating electrodes are formed on both major surfaces of a piezoelectric substrate, and sealed spaces are formed between the vibrating electrodes and sealing electrodes respectively on the major surfaces for allowing vibration of the vibrating electrodes.

Recently, communication equipment and electronic equipment have been reduced in size and thickness. Consequently, components mounted on these equipments are increasingly required to be reduced in size and thickness.

SUMMARY

According to one aspect of the present invention, a piezoelectric component includes a piezoelectric oscillating element, a pair of frames, a pair of sealing substrates, a pair of input/output terminal electrodes, and ground terminal electrodes. The piezoelectric oscillating element is composed of a pair of electrodes which are disposed on both major surfaces of the piezoelectric substrate. The pair of electrodes at least partially face each other with the piezoelectric substrate therebetween. The pair of frames are arranged on the respective major surfaces of the piezoelectric substrate so as to surround the regions of the pair of electrodes facing each other. The pair of sealing substrates are composed of a light-transmissive resin material arranged so as to cover the respective external surfaces of the pair of frames. The pair of input/output terminal electrodes are respectively connected to the pair of electrodes. The ground terminal electrodes are on the side faces of the piezoelectric substrate. The pair of electrodes comprises vibrating electrodes facing each other with the piezoelectric substrate therebetween, extractor electrodes connecting the vibrating electrodes to the input/output terminal electrodes, and capacitor electrodes protruding from the vibrating electrodes or the extractor electrodes toward the ground terminal electrodes and generating capacitors with the ground terminal electrodes.

According to another aspect of a present invention, a method of manufacturing the piezoelectric component has three steps. In the first step, a piezoelectric mother substrate provided with electrodes on both major surfaces thereof and having a plurality of element regions which are each separately formed into a piezoelectric oscillating element is prepared. In the second step, lattice bodies composed of a light-transmissive resin material are formed on both major surfaces of the piezoelectric mother substrate, wherein the lattice bodies are divided together with the element regions along the boundaries of the element regions into frames on the respective piezoelectric oscillating elements. In the third step, a plurality of sealed spaces by the piezoelectric mother substrate, the parts of the lattice bodies which become the frames, and a sealing mother substrate composed of a light-transmissive resin material are formed by attaching the sealing mother substrate so as to cover the lattice bodies at one major surface side.

DETAILED DESCRIPTION

Figure 1:
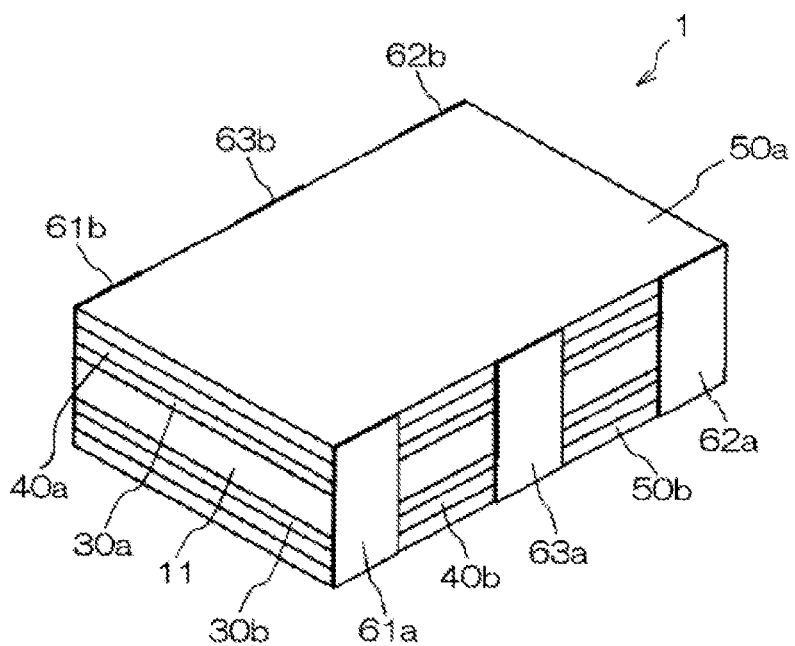
FIG. 1 is an external perspective view schematically illustrating a piezoelectric component according to an embodiment of the present invention.
Figure 2:
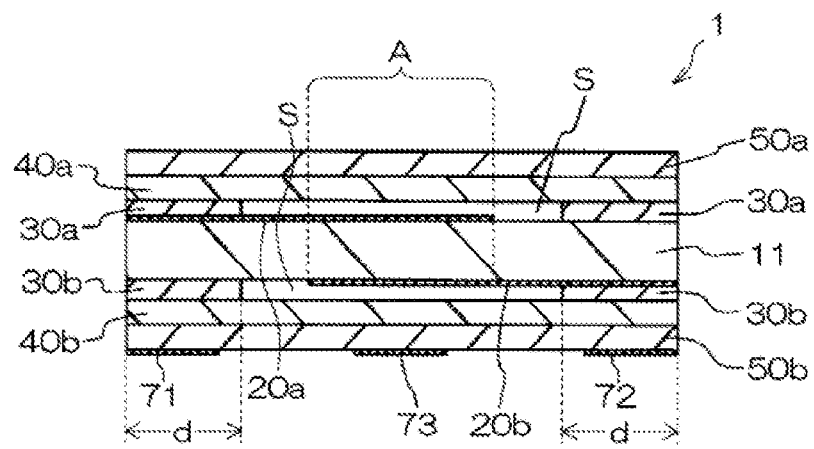
FIG. 2 is a longitudinal sectional view schematically illustrating the piezoelectric component according to an embodiment of the present invention.
Figure 3:
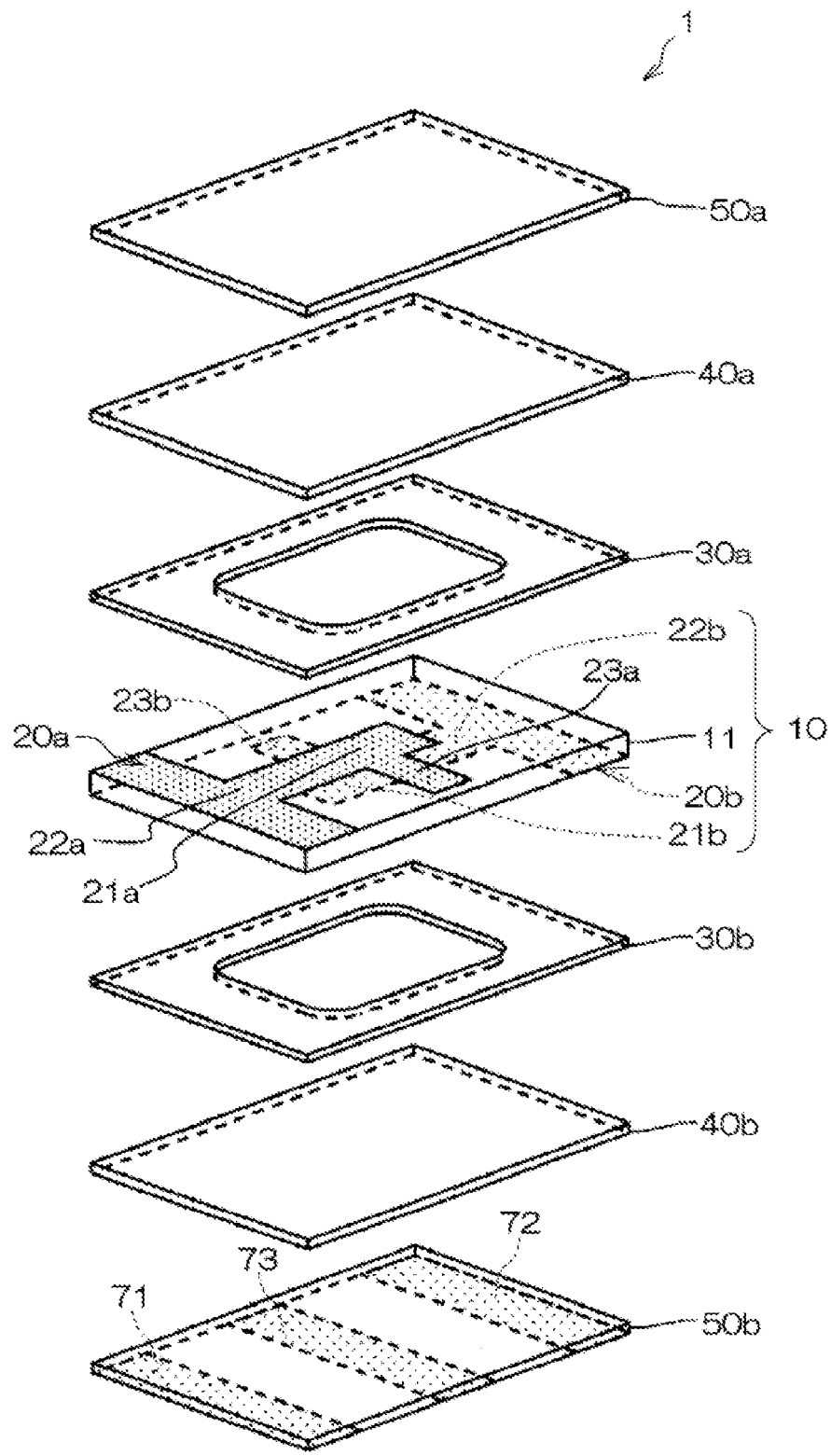
FIG. 3 is an exploded perspective view schematically illustrating the piezoelectric component according to an embodiment of the present invention.
Figure 4:
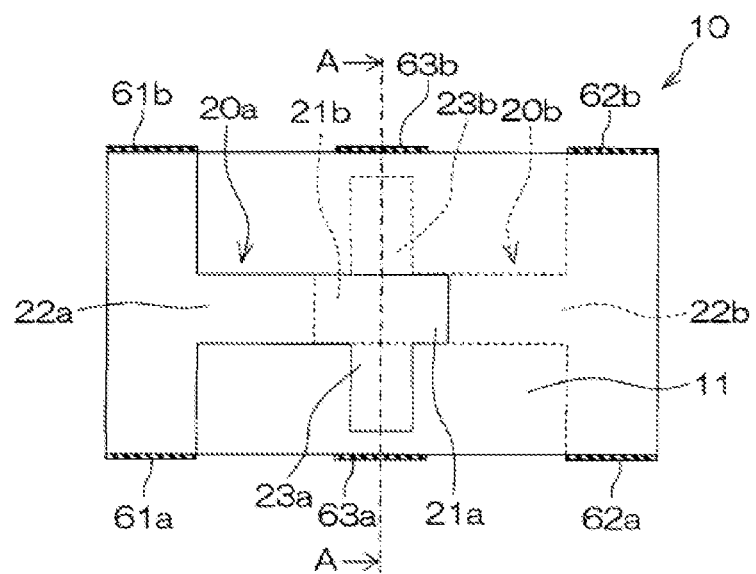
FIG. 4 is a plan view of a piezoelectric substrate used in the piezoelectric component shown in FIG. 1.
Figure 5:
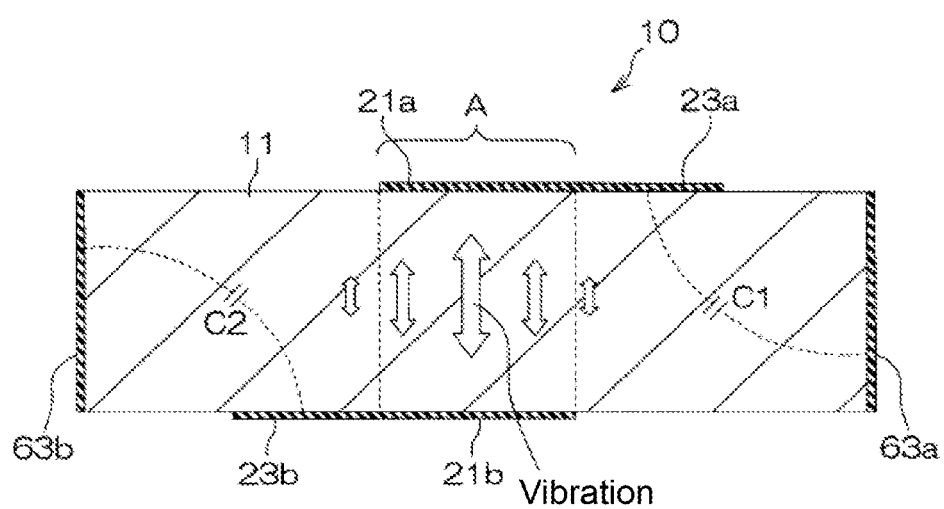
FIG. 5 is a cross-sectional view taken along A-A line of the piezoelectric substrate used in the piezoelectric component shown in FIG. 1.
Figure 6:
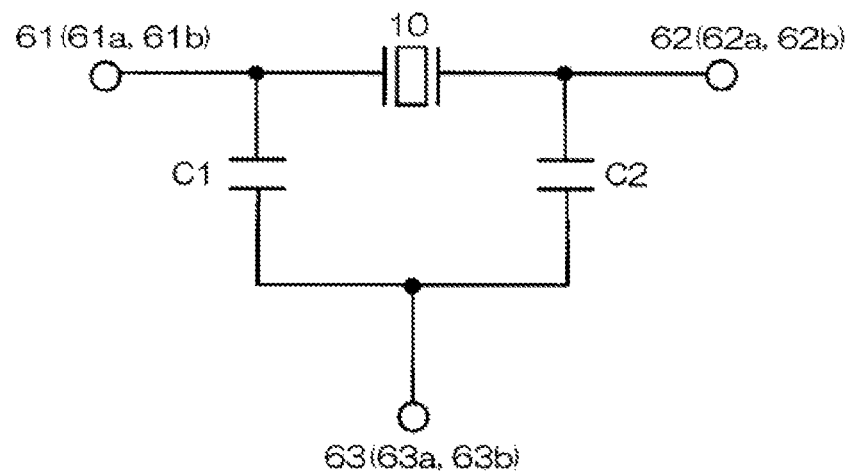
FIG. 6 is an equivalent circuit diagram of the piezoelectric component according to an embodiment of the present invention.

FIG. 1 is an external perspective view schematically illustrating a piezoelectric component according to an embodiment of the present invention. In this embodiment, FIG. 2 is a longitudinal sectional view of the piezoelectric component shown in FIG. 1, and FIG. 3 is an exploded perspective view of the piezoelectric component shown in FIG. 1. Also in this embodiment, FIG. 4 is a plan view of a piezoelectric oscillating element used in the piezoelectric component shown in FIG. 1, and FIG. 5 is a cross-sectional view taken along A-A line. Additionally in this embodiment, FIG. 6 is an equivalent circuit diagram of the piezoelectric component shown in FIG. 1.

The piezoelectric component 1 has a structure including a piezoelectric oscillating element 10 in which a pair of electrodes 20a and 20b are formed on both major surfaces of a piezoelectric substrate 11 so as to partially face each other with the piezoelectric substrate 11 therebetween; a pair of frames 30a and 30b disposed on the respective both major surfaces of the piezoelectric substrate 11 so as to surround the facing area A of the pair of electrodes 20a and 20b; a pair of sealing substrates 40a and 40b arranged so as to cover the respective external surfaces of the pair of frames 30a and 30b; and coating layers 50a and 50b disposed on the external surfaces of the pair of sealing substrates 40a and 40b.

The electrode 20a is connected to a pair of input/output terminal electrodes 61a and 61b disposed on the side faces of the piezoelectric component 1, and the electrode 20b is connected to a pair of input/output terminal electrodes 62a and 62b disposed on the side faces of the piezoelectric component 1. Furthermore, ground terminal electrodes 63a and 63b are respectively disposed between the input/output terminal electrodes 61a and 62a and between 61b and 62b on the side faces of the piezoelectric component 1.

The pair of input/output terminal electrodes 61a and 61b is collectively represented by reference numeral 61, the pair of input/output terminal electrodes 62a and 62b is collectively represented by reference numeral 62, and the ground terminal electrodes 63a and 63b are collectively represented by reference numeral 63.

The input/output terminal electrodes 61 and 62 and the ground terminal electrodes 63 are disposed on both side faces of the piezoelectric substrate 11, i.e., the input/output terminal electrodes 61a and 62a and the ground terminal electrode 63a are disposed on one side face and the input/output terminal electrodes 61b and 62b and the ground terminal electrode 63b are disposed on the other side face.

In addition, external connection electrodes 71, 72, and 73 are disposed on the bottom face of the piezoelectric component 1. The input/output terminal electrodes 61a and 61b are connected to the external connection electrode 71, the input/output terminal electrodes 62a and 62b are connected to the external connection electrode 72 and the ground terminal electrodes 63a and 63b are connected to the external connection electrode 73.

As shown in FIGS. 4 and 5, the electrode 20a of the pair of electrodes 20a and 20b disposed on both major surfaces of the piezoelectric substrate 11 comprises a vibrating electrode 21a, an extractor electrode 22a for connecting the vibrating electrode 21a to the input/output terminal electrodes 61a and 61b, and a capacitor electrode 23a extending from the vibrating electrode 21a toward the ground terminal electrode 63a to generate a capacitor with the ground terminal electrode 63a.

Similarly, the electrode 20b comprises a vibrating electrode 21b, an extractor electrode 22b for connecting the vibrating electrode 21b to the input/output terminal electrodes 62a and 62b, and a capacitor electrode 23b extending from the vibrating electrode 21b toward the ground terminal electrode 63b to generate a capacitor with the ground terminal electrode 63b.

The vibrating electrodes 21a and 21b are disposed so as to partially face each other with the piezoelectric substrate 11 therebetween. Energy is confined between the vibrating electrodes 21a and 21b by applying an electric field between the vibrating electrodes 21a and 21b, and thereby thickness vibration is excited (see FIG. 5). As a result, the piezoelectric oscillating element 10 resonates at a certain frequency.

In addition, a load capacitor C1 shown in the equivalent circuit diagram of FIG. 6 is generated between the capacitor electrode 23a and the ground terminal electrode 63a, and a load capacitor C2 shown in the equivalent circuit diagram of FIG. 6 is generated between the capacitor electrode 23b and the ground terminal electrode 63b.

Consequently, as a whole, a piezoelectric component 1 includes a piezoelectric oscillating element 10 and load capacitors C1 and C2, as shown in FIG. 6.

The characteristic of the piezoelectric component 1 according to this embodiment is that the sealing substrates 40a and 40b are composed on a light-transmissive resin material.

Therefore, it can be confirmed by appearance inspection from the outside of the sealing substrates 40a and 40b during the manufacturing processes whether or not the vibrating electrodes 21a and 21b are in contact with the frames 30a and 30b, whether or not sealing widths (indicated by "d" in FIG. 2) formed by the frames 30a and 30b are sufficient, or whether or not continuous bubbles or the like, which reduce the hermeticity of sealed spaces, are present in the insides of the sealing substrates or in the interfaces between the sealing substrates and the frames. Thereby, a piezoelectric component 1 having high reliability can be obtained.

The light transmittance of the sealing substrates 40a and 40b is preferably 25% or more for readily conducting appearance inspection without using a specific light source. The state of sealed spaces can be visually inspected under usual room brightness (about 1500 lux) by adjusting the transmittance to 25% or more. If the light transmittance of the sealing substrates 40a and 40b is less than 25%, it is less easy to visually inspect the state of sealed spaces. The light transmittance in the present invention is a value that can be measured using a spectrophotometer. Specifically, the light transmittance of sealing substrates 40a and 40b is determined by irradiating each of the sealing substrates 40a and 40b with visible light (400 to 800 nm), measuring intensities of the light before and after the transmission through the sealing substrate by a spectrophotometer, and calculating a ratio of the light intensity after the transmission to the intensity before the transmission (light intensity transmitted through a resin substrate/light intensity of a light source).

Furthermore, the sealing substrates 40a and 40b can be reduced in thickness by forming them with a resin material, which is good in workability. Thus, a piezoelectric component 1 with a reduced thickness can be obtained.

In addition, in the piezoelectric component 1 according to this embodiment, the resin material constituting the sealing substrates 40a and 40b is good in elasticity and toughness.

Consequently, the sealing substrates 40a and 40b themselves have high resistance to external forces and thermal and mechanical shocks and simultaneously absorb and relieve external forces and shocks to protect the piezoelectric substrate 11.

Thereby, a piezoelectric component 1 having high reliability can be obtained. Materials for the sealing substrates 40a and 40b will be described in detail below.

In the piezoelectric component 1 according to this embodiment, frames 30a and 30b composed of a light-transmissive resin material are preferred.

In such a case, it can be easily visually inspected from the outsides of the sealing substrates 40a and 40b whether or not, for example, continuous bubbles, which reduce the hermeticity of sealed spaces S formed by the piezoelectric substrate 11, the frames 30a and 30b, and the sealing substrates 40a and 40b, are present in the insides of the frames 30a and 30b or in the interfaces between the frames 30a and 30b and the piezoelectric substrate 11. Thereby, a piezoelectric component 1 having high reliability can be obtained. Whether or not bubbles are present in the interfaces of the frames 30a and 30b and the piezoelectric substrate 11 can be easily visually inspected by adjusting the light transmittances of the sealing substrates 40a and 40b and the frames 30a and 30b to 50% or more, even if after the sealing substrates 40a and 40b are formed on the external surfaces of the frames 30a and 30b. Therefore, in one embodiment it is preferable that the sealing substrates 40a and 40b and the frames 30a and 30b each have a light transmittance of 50% or more.

In addition, in the piezoelectric component 1 according to this embodiment, coating layers 50a and 50b composed of a light-shielding (opaque) resin material are disposed on the external surfaces of the sealing substrates 40a and 40b. These coating layers 50a and 50b are provided with marks (denoted by M in FIG. 16). The "mark" is, for example, the serial number of a piezoelectric component 1 or a trademark identifying the manufacturer.

If a mark is directly provided to the sealing substrate 40a or 40b, which is light transmissive, the mark is difficult to be identified.

Therefore, a piezoelectric component 1 improved in visibility of marks can be obtained by disposing the light-shielding coating layers 50a and 50b and marking the coating layers 50a and 50b, compared to a case in which marks are directly provided to the sealing substrates 40a and 40b composed of a light-transmissive resin material. At the same time, these coating layers 50a and 50b composed of a light-shielding resin material can protect the sealing substrates 40a and 40b.

Furthermore, in the piezoelectric component 1 according to this embodiment, as shown in FIG. 5, a capacitor C1 is generated between the capacitor electrode 23a and the ground terminal electrode 63a, and a capacitor C2 is generated between the capacitor electrode 23b and the ground terminal electrode 63b. Thereby, it is not necessary to separately form capacitor elements for generating load capacitors C1 and C2. Therefore, a piezoelectric component 1 containing a piezoelectric oscillating element 10 and load capacitors C1 and C2 can be miniaturized.

As shown in FIG. 4 which is a plan view of a piezoelectric substrate 11, the capacitor electrode 23a and the capacitor electrode 23b are preferably disposed not to face each other with the piezoelectric substrate 11 therebetween, namely, disposed so as to be shifted from each other.

Thereby, the capacitors C1 and C2 can be obtained without significantly damping the thickness vibration generated in the vibrating electrodes 21a and 21b. This is because, as shown in the cross-sectional view of FIG. 5, the capacitors C1 and C2 are formed in regions remote from the facing area A of the vibrating electrode 21a and the vibrating electrode 21b, and the largest vibration is at the center of the facing area A and the vibration is decreased with the distance from the center toward the outside. Therefore, even if electric fields are generated by the capacitors C1 and C2, the electric fields rarely affect the thickness vibration in the facing area A.

Furthermore, since the frames 30a and 30b composed of an insulative resin are disposed on the piezoelectric substrate 11 between the capacitor electrode 23a and the ground terminal electrode 63a and between the capacitor electrode 23b and the ground terminal electrode 63b, respectively, the capacities of the capacitors C1 and C2 can be increased. This is because the frames 30a and 30b have a dielectric constant higher than that of the air.

Furthermore, the frames 30a and 30b can block the adhesion of metallic foreign materials. Therefore, even if the distances between the capacitor electrode 23a and the ground terminal electrode 63a and between the capacitor electrode 23b and the ground terminal electrode 63b are reduced, electrical short between the electrodes caused by, for example, adhesion of a metallic foreign material can be avoidable.

Figure 7:
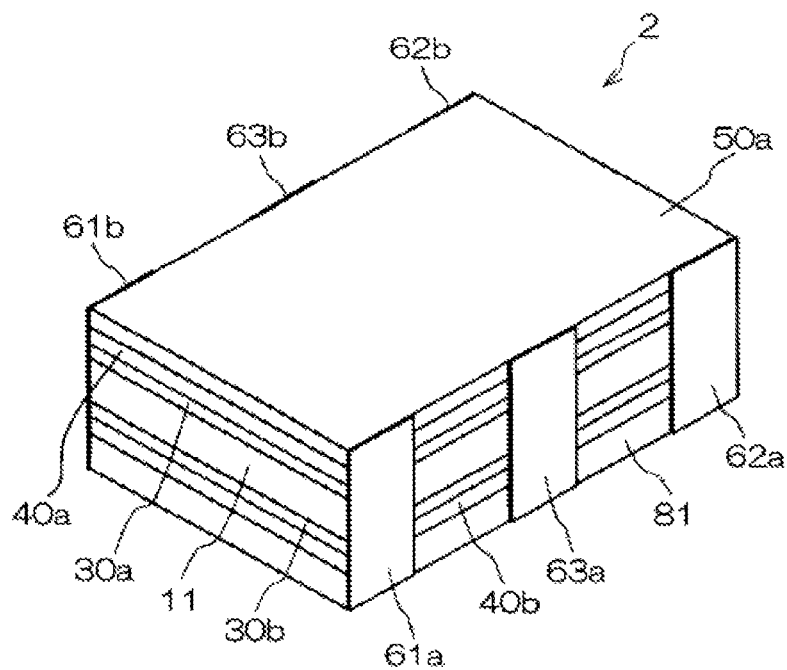
FIG. 7 is an external perspective view schematically illustrating a piezoelectric component according to an embodiment of the present invention.

FIG. 7 is an external perspective view schematically illustrating a piezoelectric component according to another embodiment of the present invention.

Figure 8:
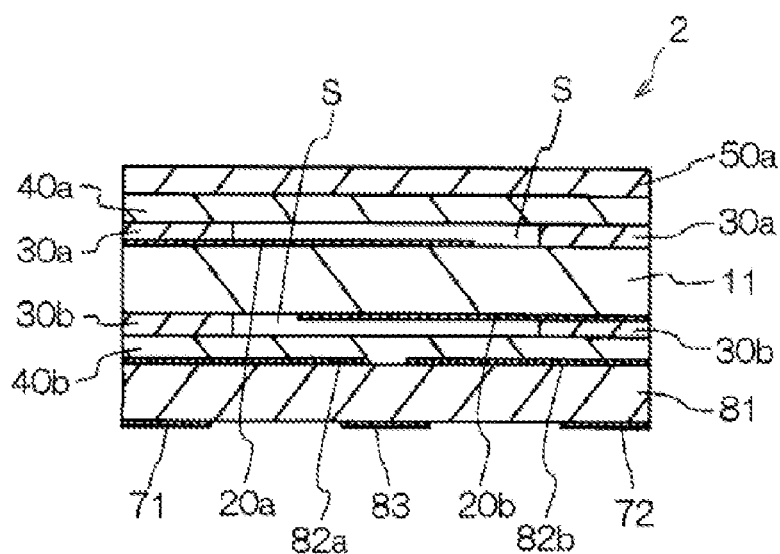
FIG. 8 is a longitudinal sectional view schematically illustrating the piezoelectric component according to an embodiment of the present invention.
Figure 9:
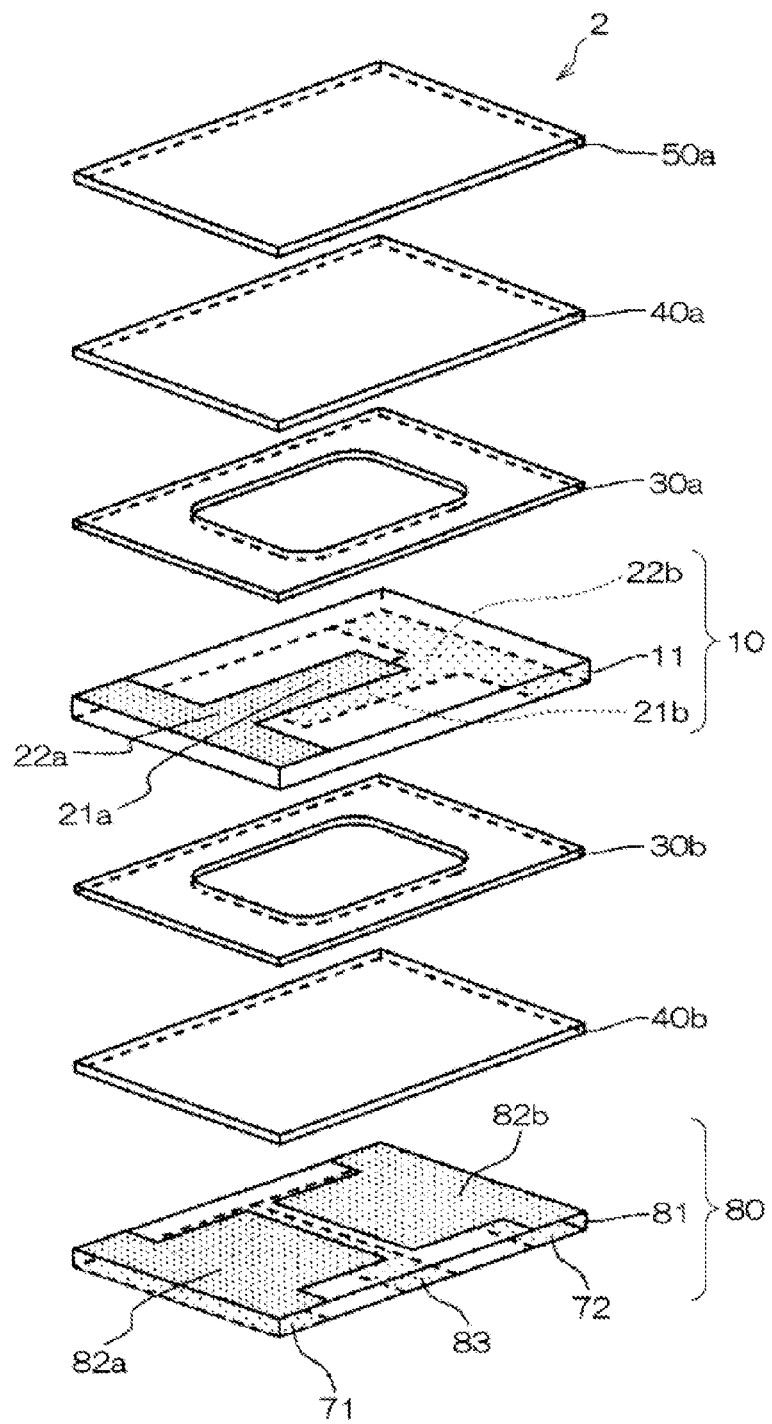
FIG. 9 is an exploded perspective view schematically illustrating the piezoelectric component according to an embodiment of the present invention.

FIG. 8 is a longitudinal sectional view schematically illustrating the piezoelectric component shown in FIG. 7, and FIG. 9 is an exploded perspective view of the piezoelectric component shown in FIG. 7.

Figure 10:
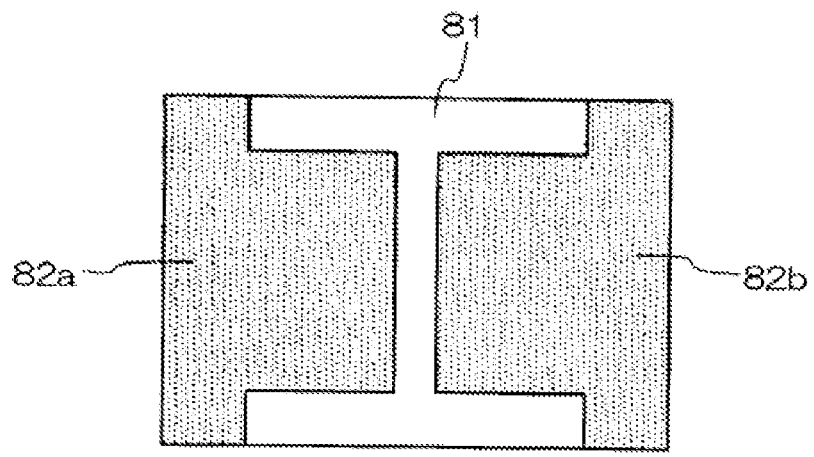
FIG. 10 is a top view illustrating a capacitor element used in the piezoelectric component according to the embodiment of the present invention.
Figure 11:
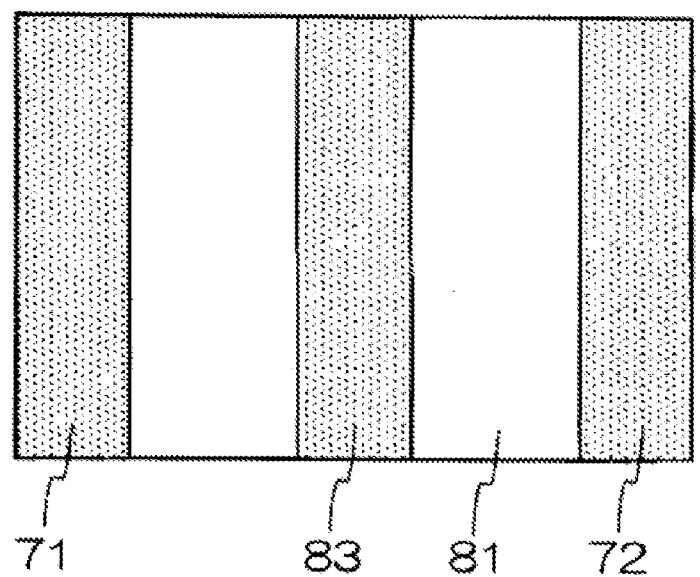
FIG. 11 is a bottom view illustrating the capacitor element used in the piezoelectric component according to an embodiment of the present invention.

FIGS. 10 and 11 are a top view and a bottom view, respectively, schematically illustrating a capacitor element used in the piezoelectric component shown in FIG. 7.

In this embodiment, only elements different from those of the above-mentioned embodiment will be described. The same elements are referred to by the same reference numerals, and their description is omitted.

The piezoelectric component 2 according to this embodiment is characterized in that capacitor electrodes 23a and 23b are not formed on the piezoelectric substrate 11 and, instead, a capacitor element 80 is disposed on the bottom face of a sealing substrate 40b.

As shown in FIGS. 9, 10, and 11, the capacitor element 80 consists of a dielectric substrate 81, a pair of hot-side capacitor electrodes 82a and 82b disposed on the top face of the dielectric substrate 81, and a ground-side capacitor electrode 83 disposed on the bottom face of the dielectric substrate 81.

The hot-side capacitor electrode 82a is connected to an extractor electrode 22a disposed on one major surface of the piezoelectric substrate 11 and to an external connection electrode 71 disposed on the bottom face of the dielectric substrate 81 via input/output terminal electrodes 61a and 61b, respectively. The hot-side capacitor electrode 82b is connected to an extractor electrode 22b disposed on another major surface of the piezoelectric substrate 11 and to an external connection electrode 72 disposed on the bottom face of the dielectric substrate 81 via input/output terminal electrodes 62a and 62b, respectively. The ground-side capacitor electrode 83 is arranged between the external connection electrodes 71 and 72 on the bottom face of the dielectric substrate 81. Both ends of the ground-side capacitor electrode 83 are connected to the ground terminal electrodes 63a and 63b, respectively. The ground-side capacitor electrode 83 also has a function as an external connection electrode.

As shown in FIG. 6, a load capacitor C1 is formed between the hot-side capacitor electrode 82a and the ground-side capacitor electrode 83, and a load capacitor C2 is formed between the hot-side capacitor electrode 82b and the ground-side capacitor electrode 83. Consequently, a piezoelectric component 2 containing a piezoelectric oscillating element 10 and the load capacitors C1 and C2, as an equivalent circuit diagram shown in FIG. 6, is obtained.

In the piezoelectric component 2 according to this embodiment, since the hot-side capacitor electrode 82a and the ground-side capacitor electrode 83 are disposed so as to face each other with the dielectric substrate 81 therebetween, a capacitor C1 with a large capacity can be generated between the hot-side capacitor electrode 82a and the ground-side capacitor electrode 83. Similarly, since the hot-side capacitor electrode 82b and the ground-side capacitor electrode 83 are disposed so as to face each other with the dielectric substrate 81 therebetween, a capacitor C2 with a large capacity can be generated between the hot-side capacitor electrode 82b and the ground-side capacitor electrode 83.

Next, a method for manufacturing the piezoelectric component will be described with reference to the piezoelectric component 1 shown in FIGS. 1 to 5.

FIGS. 12 to 16 are plan views schematically illustrating each process of manufacturing a piezoelectric component, according to this embodiment.

FIGS. 12 to 16 are plan views, viewed from the upper face side. The part of the piezoelectric component under the piezoelectric mother substrate 91 is not shown, but is the same as that above the piezoelectric mother substrate 91.

Figure 12:
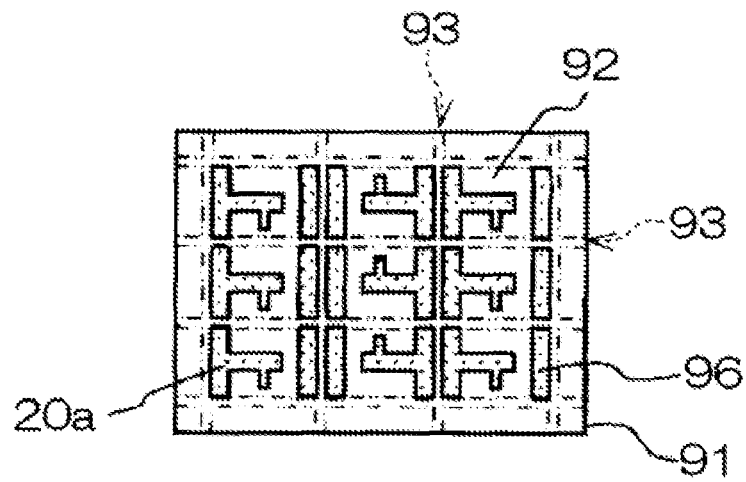
FIG. 12 is a plan view schematically illustrating a process of manufacturing a piezoelectric component according to an embodiment of the present invention.

In the method of manufacturing a piezoelectric component according to this embodiment, first, a piezoelectric mother substrate 91 having a plurality of element regions 92 which are each separately formed into a piezoelectric oscillating element 10 is prepared (FIG. 12).

Each element region 92 of the piezoelectric mother substrate 91 is previously provided with electrodes 20a and 20b on the respective major surfaces thereof. The boundaries between each element region 92 of the piezoelectric mother substrate 91 are provided with dicing lines 93 which are removed by dicing later.

Figure 13:
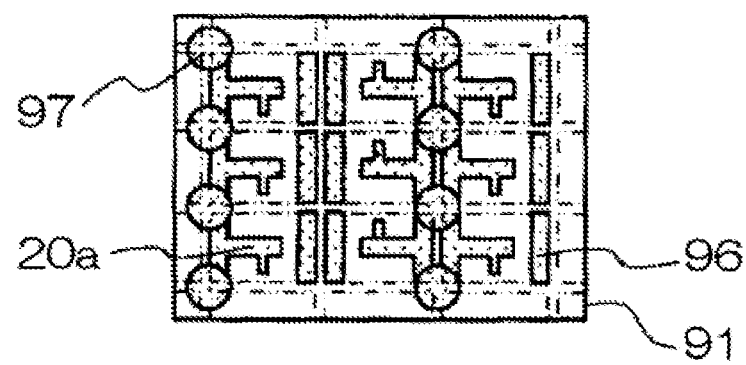
FIG. 13 is a plan view schematically illustrating another process of manufacturing the piezoelectric component according to an embodiment of the present invention.

Then, an electrically conductive bump 97, which is divided into 4 parts by dicing later, is formed at each position which becomes a portion between the ends of adjacent extractor electrodes 22a of the electrodes 20a and at each position which becomes a portion between the ends of adjacent extractor electrodes 22b of the electrodes 20b (FIG. 13).

This provides a favorable connection of the extractor electrode 22a to terminal electrodes 61a and 61b and a favorable connection of the extractor electrode 22b to terminal electrodes 62a and 62b.

Figure 14:
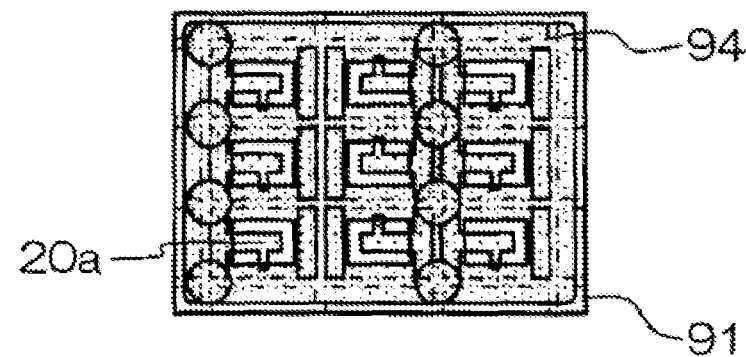
FIG. 14 is a plan view schematically illustrating another process of manufacturing the piezoelectric component according to an embodiment of the present invention.

Then, lattice bodies 94 composed of a light-transmissive resin material are formed on both major surfaces of the piezoelectric mother substrate 91 so as to cover both major surfaces, other than regions of vibrating electrodes 21a and 21b, of the piezoelectric mother substrate 91 (FIG. 14).

The lattice bodies 94 are to be divided together with the element regions 92 along the dicing lines 93 into frames 30 on the respective piezoelectric oscillating elements 10.

Figure 15:
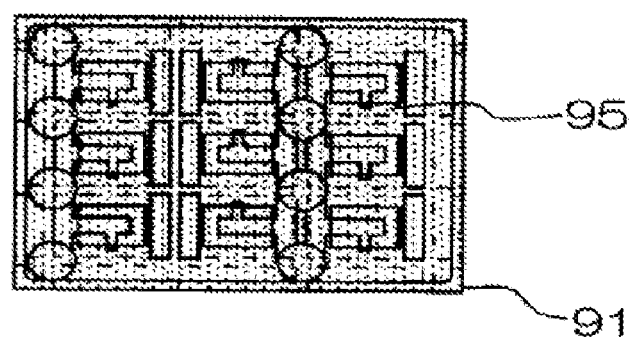
FIG. 15 is a plan view schematically illustrating another process of manufacturing the piezoelectric component according to an embodiment of the present invention.

Then, sealing mother substrates 95 composed of a light-transmissive resin material are attached so as to cover the lattice bodies 94 (FIG. 15).

Thus, each element region 92 of the piezoelectric mother substrate 91, each portion of the lattice body 94 which becomes the frame 30, and the sealing mother substrate 95a form a sealed space S at each element region 92.

Since the lattice bodies 94 and the sealing mother substrates 95 are both composed of light-transmissive resin materials, the formed state of the sealed spaces S can be observed by appearance inspection such as visual observation or image recognition. In addition, it can be observed by appearance inspection such as visual observation or image recognition whether or not continuous bubbles or the like, which reduce the hermeticity of sealed spaces S, are present in the insides of the lattice bodies 94, in the interfaces between the lattice bodies 94 and the piezoelectric mother substrate 91, or interfaces between the lattice bodies 94 and the sealing mother substrates 95.

Furthermore, it can be checked by appearance inspection such as visual observation or image recognition whether or not there are narrowed portions in sealing widths (indicated by "d" in FIG. 2) formed by the frames 30a and 30b.

When a defective piece is found by these appearance inspections, the defective piece can be removed after the dividing process. Therefore, a piezoelectric component improved in reliability can be manufactured.

Figure 16:
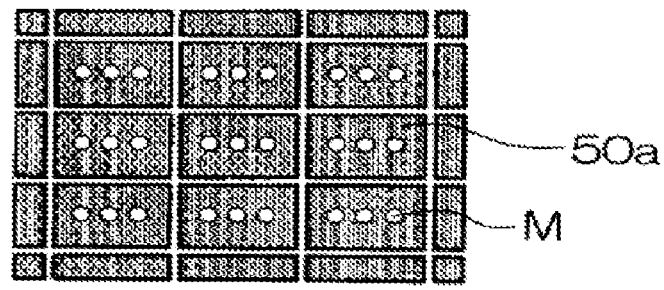
FIG. 16 is a plan view schematically illustrating another process of manufacturing the piezoelectric component according to an embodiment of the present invention.

Then, after the process of forming a plurality of sealed spaces S shown in FIG. 15, coating layers 50a and 50b composed of a light-shielding (opaque) resin are formed on the respective external surfaces of the sealing mother substrates 95 (FIG. 16).

On the coating layers 50a and 50b composed of a light-shielding resin material, marks M are formed.

Though one additional step, for example, the step of forming the coating layers 50a and 50b, is necessary for providing marks M on the coating layers 50a and 50b, the visibility of the marks M can be enhanced compared to the case in which the marks M are directly provided on the sealing substrates 40a and 40b composed of a light-transmissive resin material. Consequently, a false perception of marks M can be reduced, and a manufacturing method improved in productivity can be provided. In marks M with a depth of 3 μm or more, the visibility is further improved.

Furthermore, the coating layers 50a and 50b can be marked with marks M by using laser light, which is difficult to be used for light-transmissive resins. Thereby, marks M improved in wear resistance can be provided. The laser used in printing may be a YAG laser (wavelength: 1064 nm) or a CO2 laser (wavelength: 10.6 μm), for example. It is preferable that the laser have a shorter wavelength in view of improved color development of the resin used as the coating layer. In general, a laser having a wavelength of approximately 1064 nm is preferred.

The process using laser light is improved in printing speed compared to that in printing such as ink-jet printing. Therefore, a manufacturing method improved in productivity can be provided.

Then, external connection electrodes 71, 72, and 73 are formed on the bottom face of the lower coating layer 50b, and then piezoelectric components are cut into each one by dicing (FIG. 16). The dicing can be precisely performed by putting marks for dicing with the same material as that of the external connection electrodes 71, 72, or 73 when they are formed.

In the method of manufacturing a piezoelectric component according to this embodiment, as shown in FIG. 12, reference patterns 96 may be formed together with the electrodes 20a and 20b on both major surfaces of the piezoelectric mother substrate 91. The reference patterns 96 are formed along and near the dicing lines 93 for confirming the dicing lines 93 so as to have the same width as that of a dicing blade. In such a case, the coating layers 50a and 50b are not formed over the entire external surfaces of the upper and lower sealing substrates 40a and 40b, but are formed only over the regions where marks are provided so that the reference patterns 96 are not covered with the coating layers 50a and 50b. The reference patterns 96 on the major surfaces of the piezoelectric substrate 11 can be viewed by thus forming the coating layers 50a and 50b at the defined areas. Therefore, dicing can be performed using the reference patterns 96 as indication for dicing.

Lastly, input/output terminal electrodes 61 and 62 and ground terminal electrodes 63 are formed on the respective side faces to complete a piezoelectric component 1.

Shapes and manufacturing materials of the piezoelectric component according to the present invention will now be described.

The piezoelectric substrate 11 and the piezoelectric mother substrate 91 are composed of a piezoelectric ceramic material including a base material such as lead zirconate titanate (PZT), lead titanate (PT), sodium potassium niobate (Na1-xKxNbO3), or a bismuth layer-structured compound (for example: MBi4Ti4O15, M: divalent alkaline earth metal element); or a piezoelectric single crystal such as quartz crystal or lithium tantalate.

The piezoelectric substrate 11 is preferably a rectangle having a length of 0.6 to 5 mm, a width of 0.2 to 5 mm, and a thickness of 40 μm to 1 mm, from the viewpoint of miniaturization and properties for mounting on a circuit substrate.

Furthermore, the piezoelectric substrate 11 is not required to have a uniform thickness over the entire surface. For example, a vibration area A may have a thickness smaller or larger than that of the surrounding area, in order to enhance the energy confinement of thickness vibration and improve the resonance characteristics.

In addition, in order to further improve the resonance characteristics, for example, the piezoelectric substrate 11 may be provided with an internal electrode composed of Ag—Pd as a vibration electrode.

Furthermore, a piezoelectric substrate 11 having a relative dielectric constant of 1000 or less is preferred, in view of better resonance in a high frequency region.

In a piezoelectric substrate 11 composed of a ceramic material, a raw material powder is formed into a sheet by, for example, adding a binder to the raw material powder and pressing the mixture into a sheet or mixing the raw material powder with water and a dispersing agent using a ball mill, drying the mixture, adding a binder, a solvent, a plasticizer, and the like to the mixture, and forming the resulting mixture into a sheet by a doctor blade method; the sheet is fired at a peak temperature of 1100 to 1400° C. for 0.5 to 8 hours to form a substrate; and the substrate is polarized in the thickness direction by applying, for example, a voltage of 3 to 6 kV/mm at 80 to 200° C. to obtain a piezoelectric substrate 11 having the desired piezoelectric characteristics.

In a piezoelectric substrate 11 composed of a piezoelectric single crystal material, a piezoelectric substrate 11 having desired piezoelectric characteristics is obtained by cutting an ingot (base material) of the piezoelectric single crystal material so as to have a predetermined crystal direction.

The electrodes 20a and 20b are preferably composed of a metal film such as gold, silver, copper, or aluminum, from the viewpoint of electrical conductivity. The thickness is preferably in the range of 0.1 to 3 μm. In a metal film having a thickness less than 0.1 μm, for example, the conductivity tends to be readily decreased by oxidation when the metal film is left in the air at a high temperature. In a metal film having a thickness larger than 3 μm, the film tends to be readily peeled.

The adhesion of the metal films described above to the substrate may be performed by applying the film to the substrate by a vacuum deposition method, a PVD method, a sputtering method, or a thick film printing method and then baking them.

In addition, in order to enhance the adhesion with the piezoelectric substrate 11, for example, base electrode layers composed of a material, such as Cr, having a high adhesion to a ceramic substrate are previously formed and desired metal films may be formed thereon.

After adhesion of the metal films to both of the entire major surfaces of the piezoelectric substrate 11, photoresist films having a thickness of 1 to 10 μm are formed on the metal films by spin coating, for example. Then, various types of electrodes can be formed by patterning by photoetching.

The vibrating electrodes 21 are arranged at approximately the center of both major surfaces of the piezoelectric substrate 11 and are of a rectangular shape with longitudinal and transverse lengths of several tens of micrometers to several millimeters or of a circular shape. The details in shape and size are determined based on resonator characteristics and other desired electric characteristics.

The frames 30 (and the lattice bodies 94) are composed of a light-transmissive resin material, for example, a resin material containing a base material such as a phenol resin, a polyimide resin, or an epoxy resin.

In particular, a base material of the epoxy resin is not only good in insulating properties, but also has high adhesion to ceramics and is good in moisture resistance and heat resistance, and thereby is preferred.

An epoxy resin of a curing type, not hydrolyzed, is preferred. In addition, an epoxy resin to which particles of rutile titanium oxide are added for reducing the moisture permeability or to which 2,4-diamino-6-vinyl-S-triamine and isocyanuric acid are added for enhancing insulation properties can be used.

These resin materials can be used, for example, a thermal-curable or photo-curable resin is applied on the piezoelectric substrate 11 by screen printing or transcription so as to have a thickness of 1 to 80 μm and is then cured by heating or ultraviolet irradiation.

Frames 30 (and the lattice bodies 94) having a thickness of 20 to 60 μm are particularly preferred from the viewpoint of achieving a piezoelectric component reduced in thickness while a favorable height of the sealed spaces is maintained.

The lattice bodies 94 formed on the piezoelectric substrate 11 may have upper faces having convex shapes. With such shapes, bubbles, which reduce hermeticity of the sealed spaces, are effectively prevented from remaining in the connecting faces of the lattice bodies 94 and the sealing substrates 40 during connecting them.

The sealing substrates 40a and 40b are composed of a light-transmissive resin material and are attached on the top and bottom faces of the piezoelectric oscillating element 10 via the frames 30a and 30b and form sealed spaces with the frames 30a and 30b. The longitudinal and transverse lengths of the sealing substrates 40a and 40b are usually approximately the same as those of the piezoelectric substrate 11. The thickness of the sealing substrate 40a, which is placed at the upper side, may be 10 μm or more, but the thickness of the sealing substrate 40b, which is placed at the lower side, is preferably 20 μm or more from the viewpoint of preferably achieving a function of absorbing stress from a mounting substrate and mechanical and thermal shocks, and preferably 100 μm or less from the viewpoint of reducing the thickness of the piezoelectric component.

Furthermore, the sealing substrates 40a and 40b are required to have suitable elasticity. When measured by DMA (Dynamic Mechanical Analysis), an elastic modulus in the range of 2 to 60 GPa is preferred, and that in the range of 2 to 20 GPa is particularly preferred from the viewpoint of the function of absorbing shocks.

Sealing substrates 40a and 40b (and sealing mother substrates 95) composed of a resin sheet material which is prepared by impregnating fiberglass cloth or aramid fiber cloth with a polyimide resin or an epoxy resin can suppress thermal deformation of the sealing substrate 40a to surely form sealed spaces and be improved in mechanical strength.

In particular, a polyimide resin or epoxy resin sheet containing 30 to 80% fiberglass having an adhesion function (prepreg) is preferred and is favorably cured by being maintained at 150 to 200° C. at a pressure of 0.2 to 5 MPa for 5 to 90 minutes under in a vacuum of 100 Pa or less or in the atmosphere.

Since an adhesive for attaching between the sealing substrates 40 and the lattice bodies 94 is not necessary, materials and the number of steps can be reduced, and an efficient manufacturing method is provided.

Alternatively, the sealing substrates 40 may be composed of a plurality of resin sheets having different characteristics. Such sealing substrates 40 may be improved totally in various characteristics such as mechanical strength, shock resistance, and moisture resistance.

The light transmissivity of the sealing substrates 40a and 40b composed of a resin material can be mainly adjusted by controlling the thickness of the sealing substrates 40a and 40b, types of the resin material, and types and amounts of additives added to the resin material. For example, in sealing substrates 40a and 40b including an epoxy resin as the resin material, a light transmissivity of 50% can be obtained by adding 15 wt % of a coloring additive such as carbon black based on 100 wt % of the epoxy resin and forming the sealing substrates so as to have a thickness of 150 μm.

The coating layers 50a and 50b are composed of a light-shielding resin material and are formed on the external surfaces of the sealing substrates 40a and 40b. The coating layers 50a and 50b have a thickness of 5 to 50 μm and are preferably composed of a colored resin prepared by, for example, mixing a pigment such as carbon black and a dispersing agent in a powder form with a usual resin such as an epoxy resin or a polyimide resin. In addition, the coating layers 50a and 50b may be composed of a resin material prepared by impregnating fiberglass cloth or aramid fiber cloth with a light-shielding resin.

Furthermore, at least one of the coating layers 50a and 50b is provided with various marks representing information about the piezoelectric component 1, and external connection electrodes 71, 72, and 73 are formed on the bottom face of the coating layer 50b. The marking may be performed by printing such as ink-jet printing or by stamping using laser light, as described above.

The terminal electrodes 61, 62, and 63 and the external connection electrodes 71, 72, and 73 may be highly conductive metal films, such as gold, silver, copper, or aluminum, but are preferably formed of an electrically conductive epoxy resin, from the viewpoint of adhesive strength to a resin, preferably with 75 to 95 mass % of an electrically conductive filler such as silver, copper, or nickel, from the viewpoint of electrical conductivity.

An electrically conductive resin having an appropriate elasticity can improve a function of absorbing stress from a mounting substrate and shocks. Thus, a piezoelectric component having high reliability can be obtained.

A metal filler having a smaller particle diameter is preferred, from the viewpoint of smoothing the electrically conductive resin surface and improving mountability. However, in view of printability, a metal filler having an average particle diameter of 0.5 to 5 μm is preferred.

When the electrically conductive film is too thin, the conductivity may be reduced. When the film is too thick, the electrically conductive film tends to be readily peeled off by stress during mounting. Therefore, a thickness in the range of 10 to 60 μm is preferred.

The adhesion of such an electrically conductive resin may be performed by applying the resin by a known method such as screen printing or roller transcription and then curing the resin by heating or ultraviolet irradiation.

Furthermore, at least one plating film of such as Cu, Ni, Sn, or Au may be formed on the surface of the electrically conductive resin if desired. Thereby, the solderability can be improved.

The dielectric substrate 81 has a function of forming load capacitors with the hot-side capacitor electrodes 82a and 82b and the ground-side capacitor electrode 83, and also has a function of protecting the piezoelectric substrate 11 from external forces. The dielectric substrate 81 is composed of a ferroelectric ceramic material such as lead zirconate titanate (PZT), lead titanate (PT), or barium titanate (BT) and is a rectangular single plate with a length of 0.6 to 5 mm, a width of 0.2 to 5 mm, and a thickness of several tens of micrometers to one millimeter, from the viewpoint of mountability on a circuit substrate.

This dielectric substrate 81 is prepared by forming a raw material powder into a sheet, for example, by adding a binder to the raw material powder and pressing the mixture into a sheet or by mixing the raw material powder with water and a dispersing agent using a ball mill, drying the mixture, adding a binder, a solvent, a plasticizer, and the like to the dried mixture, and forming the resulting mixture into a sheet by a doctor blade method; and firing the sheet at a peak temperature of 1100 to 1400° C. for several tens of minutes to several hours.

In the dielectric substrate 81 composed of a ferroelectric ceramic material such as lead zirconate titanate (PZT), lead titanate (PT), or barium titanate (BT), the relative permittivity of the dielectric substrate 81 can be increased. Therefore, a capacitor element 80 having a sufficiently large electrostatic capacity can be obtained. A dielectric substrate 81 having a relative permittivity of 200 to 5000 is preferred.

The hot-side capacitor electrodes 82a and 82b and the ground-side capacitor electrode 83 are formed by application of an electrically conductive resin or an electrically conductive paste by a conventional method such as screen printing and then curing the resin by ultraviolet irradiation or heating, or firing the paste.

As the electrically conductive paste, a high-temperature firing type conductive paste containing 75 to 95% mass of silver powder to which a glass powder, a resin or oil, and a solvent are added and being fired at 400 to 800° C. is preferred.

As the electrically conductive resin, a conductive resin containing 75 to 95% mass of an electrically conductive filler such as silver is preferred. In the electrically conductive paste or the electrically conductive resin, an electrode thickness of 8 to 15 μm is preferred.

The electrodes may be formed by deposition of a highly electrically conductive metal film of gold, silver, copper, aluminum, or the like by, for example, a vacuum deposition method, a PVD method, or a sputtering method; then formation of a photoresist film having a thickness of 1 to 10 μm on the metal film by, for example, spin coating; and patterning by photoetching.

In such a case, in order to enhance the adhesion of the electrodes to the piezoelectric substrate 11, an under-electrode layer composed of, for example, Cr, which has high adhesion to a ceramic substrate, may be previously formed, and then a desired metal film may be formed thereon.

The electrically conductive bump 97 is formed by application of an electrically conductive resin or an electrically conductive paste by a conventional method such as screen printing and then curing the resin by ultraviolet irradiation or heating or firing the paste.

As the electrically conductive paste, a high-temperature firing type conductive paste containing 75 to 95% mass of silver powder to which a glass powder, a resin or oil, and a solvent are added and being fired at 400 to 800° C. is preferred.

As the electrically conductive resin, a conductive resin containing 75 to 95% mass of an electrically conductive filler such as silver is preferred.

The reference patterns 96 may be formed simultaneously when the electrodes 20a and 20b are formed with the same material and method as those in the electrodes 20a and 20b. Alternatively, the reference patterns may be formed with a material, such as a non-electrically conductive pigment, different from that of the electrodes by screen printing, for example.

The present invention is not limited to the above-mentioned embodiments and can be variously modified or improved within the scope of the present invention.

For example, in the above-mentioned embodiments, the coating layers 50a and 50b are disposed at the respective external sides of the upper and lower sealing substrates 40a and 40b. However, the coating layer 50a or 50b may be disposed on only the sealing substrate 40a or on only the other sealing substrate 40b.

Furthermore, the sealing substrates 40a and 40b may be directly marked without forming the coating layers 50a and 50b. In such a case, in view of visibility of marks, it is preferable that the light transmissivity of the sealing substrates 40a and 40b be decreased to a certain degree. For example, a piezoelectric component which is improved in visibility of marks and allows visual inspection of conditions of sealed spaces can be obtained by adjusting the light transmissivity of the sealing substrates 40a and 40b to within the range of 25 to 75%, when the marking is conducted using a YAG laser. In the case that the sealing substrates 40a and 40b are directly provided with marks, the coating layers 50a and 50b are not necessary. Consequently, a piezoelectric component having a reduced thickness can be obtained. In addition, since the process of forming the coating layers 50a and 50b is not necessary, the productivity can be advantageously improved.

The invention claimed is:

1. A piezoelectric component, comprising:
   a piezoelectric layer;
   a pair of oscillation electrodes on both sides of the piezoelectric layer, the oscillation electrodes facing each other with the piezoelectric layer therebetween;
   a pair of frames on the piezoelectric layer, each frame surrounding the facing region, and comprising a resin; and
   a pair of sealing layers, each sealing layer comprising a see through material and covering a respective external surface of one of the pair of frames, wherein the see through material comprises at least one of a fiber and a cloth.

2. The piezoelectric component according to claim 1, further comprising a capacitor comprising:
   a dielectric layer; and
   two or more capacitor electrodes on both sides of the dielectric layer.

3. The piezoelectric component according to claim 2, wherein the capacitor comprises more than three capacitor electrodes.

4. The piezoelectric component according to claim 3, wherein one of the capacitor electrodes is coupled to a ground potential.

5. The piezoelectric component according to claim 1, further comprising one or more ground terminal electrodes.

6. The piezoelectric component according to claim 1, wherein the see through material comprises 30% to 80% of the at least one of a fiber and a cloth.

7. The piezoelectric component according to claim 6, wherein the see through material comprises a coloring additive.

8. The piezoelectric component according to claim 6, wherein the percentage of the at least one of a fiber and a cloth is by weight.

9. The piezoelectric component according to claim 1, wherein the see through material comprises at least 30% of the at least one of a fiber and a cloth.

10. The piezoelectric component according to claim 9, wherein the see through material comprises a coloring additive.

11. The piezoelectric component according to claim 9, wherein the percentage of the at least one of a fiber and a cloth is by weight.

12. The piezoelectric component according to claim 1, wherein the see through material comprises up to 80% of the at least one of a fiber and a cloth.

13. The piezoelectric component according to claim 12, wherein the see through material comprises a coloring additive.

14. The piezoelectric component according to claim 12, wherein the percentage of the at least one of a fiber and a cloth is by weight.

* * * * *